United States Patent [19]

Shaw et al.

[11] Patent Number: 4,936,928
[45] Date of Patent: Jun. 26, 1990

[54] SEMICONDUCTOR DEVICE

[75] Inventors: Gerard J. Shaw, San Jose; Jok Y. Go, Santa Clara, both of Calif.

[73] Assignee: Raytheon Company, Lexington, Mass.

[21] Appl. No.: 336,547

[22] Filed: Apr. 10, 1989

Related U.S. Application Data

[63] Continuation of Ser. No. 145,700, Jan. 15, 1988, abandoned.

[51] Int. Cl.$^5$ .................... H01L 21/20; H01L 33/00
[52] U.S. Cl. ...................... 148/33.4; 148/DIG. 11; 148/33; 357/34; 437/31; 437/77; 437/954
[58] Field of Search ............... 148/DIG. 13, 32, 38, 148/11, 144, 151, 33, 33.1, 33.4; 156/610-614; 357/34, 48, 49, 50; 437/31, 32, 74, 76, 77, 81, 954, 958

[56] References Cited

U.S. PATENT DOCUMENTS

| | | | |
|---|---|---|---|
| 3,769,105 | 10/1973 | Chen et al. | 437/77 |
| 3,775,196 | 11/1973 | Wakamiya et al. | 437/77 |
| 3,904,450 | 9/1975 | Evans et al. | 148/175 |
| 3,912,555 | 10/1975 | Tsuyuki | 437/77 |
| 3,928,091 | 12/1925 | Tashi et al. | 148/175 |
| 3,974,560 | 8/1976 | Mueller et al. | 29/590 |
| 3,993,512 | 11/1976 | Encinas | 437/77 |
| 4,014,718 | 3/1977 | Tomozawa et al. | 148/187 |
| 4,135,954 | 1/1979 | Chang et al. | 148/187 |
| 4,160,988 | 7/1979 | Russell | 357/44 |
| 4,216,489 | 8/1980 | Clemens et al. | 357/41 |
| 4,228,807 | 11/1981 | Enzlin et al. | 357/46 |
| 4,381,952 | 5/1983 | Rosen | 148/1.5 |
| 4,512,076 | 4/1985 | Mehrotra et al. | 29/578 |
| 4,721,684 | 1/1988 | Musumeci | 437/31 |

FOREIGN PATENT DOCUMENTS

| | | |
|---|---|---|
| 0022687 | 10/1980 | European Pat. Off. |
| 0138517 | 4/1984 | European Pat. Off. |
| 0139371 | 9/1984 | European Pat. Off. |
| 0061283 | 6/1978 | Japan ..................... 437/81 |

(List continued on next page.)

OTHER PUBLICATIONS

Jones et al., "Power Darlington Amplifier with Integrated Clamp Diode", IBM TDB, vol. 16, No. 6, pp. 1735-1736, Nov. 1973.
Ghandhi, "VLSI Fabrication Principles", John Wiley & Sons, New York, N.Y., 1983, pp. 572-575.

(List continued on next page.)

*Primary Examiner*—Brian E. Hearn
*Assistant Examiner*—William Bunch
*Attorney, Agent, or Firm*—Edmund J. Walsh; Richard M. Sharkansky

[57] ABSTRACT

A semiconductor structure is provided comprising a bulk substrate of semiconductor material having a first-type doping conductivity in a first dopant concentration. A first layer of semiconductor material is epitaxially formed on the substrate, such first layer having the first-type doping conductivity in a second dopant concentration lower than the first concentration. A second layer of semiconductor material is epitaxially formed on the first layer, the second layer having a second-type doping conductivity opposite to the first-type doping conductvity and thereby forming a P-N junction with the first layer. A plurality of regions, comprising semiconductor material having the first-type doping conductivity and extending through the second layer and a predetermined distance into the first layer, are further included for providing electrical isolation between active devices formed in different regions of the second layer. The thickness of the first layer is selected to be greater than the diffusion lengths of electron-hole pairs emitted by the bulk substrate in response to incident radiation and smaller than the thickness of the bulk substrate. With such arrangement, electron-hole pairs emitted by the substrate are substantially prevented from reaching such P-N junction, and few electron-hole pairs are emitted by the first layer, due to the small thickness thereof. Thus, electron-hole current at such P-N junction is reduced, thereby decreasing the effects of incident radiation on active devices formed in the semiconductor structure.

19 Claims, 2 Drawing Sheets

FOREIGN PATENT DOCUMENTS

| | | | |
|---|---|---|---|
| 0066188 | 6/1978 | Japan | 437/31 |
| 0095356 | 7/1980 | Japan | 437/31 |
| 0155772 | 9/1982 | Japan | 437/31 |
| 0095966 | 5/1985 | Japan | 437/31 |
| 1450626 | 1/1974 | United Kingdom . | |
| 1450293 | 5/1974 | United Kingdom . | |
| 1450749 | 11/1974 | United Kingdom . | |
| 1488958 | 3/1975 | United Kingdom . | |
| 1498531 | 4/1975 | United Kingdom . | |
| 1539426 | 3/1976 | United Kingdom . | |
| 2018511 | 4/1979 | United Kingdom . | |

OTHER PUBLICATIONS

Warner, Jr. et al., "Integrated Circuits", McGraw Hill, New York, NY, 1979, pp. 138–151.

Sorab K. Ghandhi, "VLSI Fabrication Principles", John Wiley & Sons, New York, NY, 1983, pp. 143–146.

"Experimental Realisation of a Full Adder by Substrate Fed Threshold Logic Structure"; Electronics Letters; vol. 19. No. 16; 1983; pp. 613–615; C. H. Han, et al.

"Feasibility of Substrate Fed Threshold Logic"; IEEE Journal of Solid–State Circuits; vol. SC–18, No. 2; 1983; pp. 160–164; C. H. Han et al.

"ESL, A Fast and Dense Low-Power Logic, Made in a Standard Schottky Process", by J. Lohstroh, *IEEE Journal of Solid State Circuits*, vol. SC-14, No. 3, Jun. 1979, pp. 585–590.

"Rad-Hard Array Contains 5000 Gates", *Electronic Products*, Sep. 2, 1985, pp. 42–43.

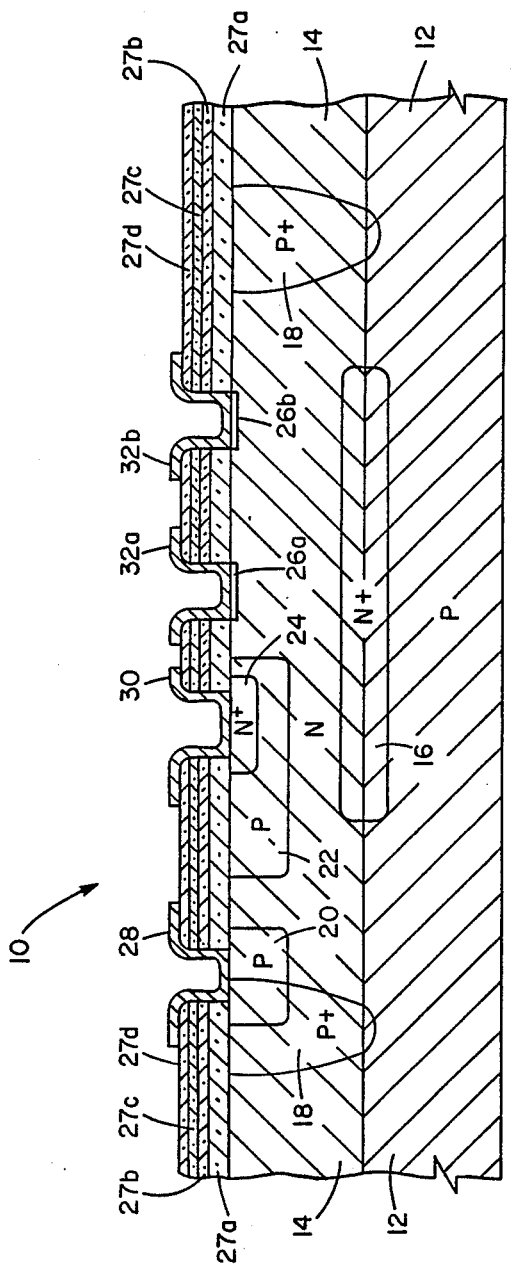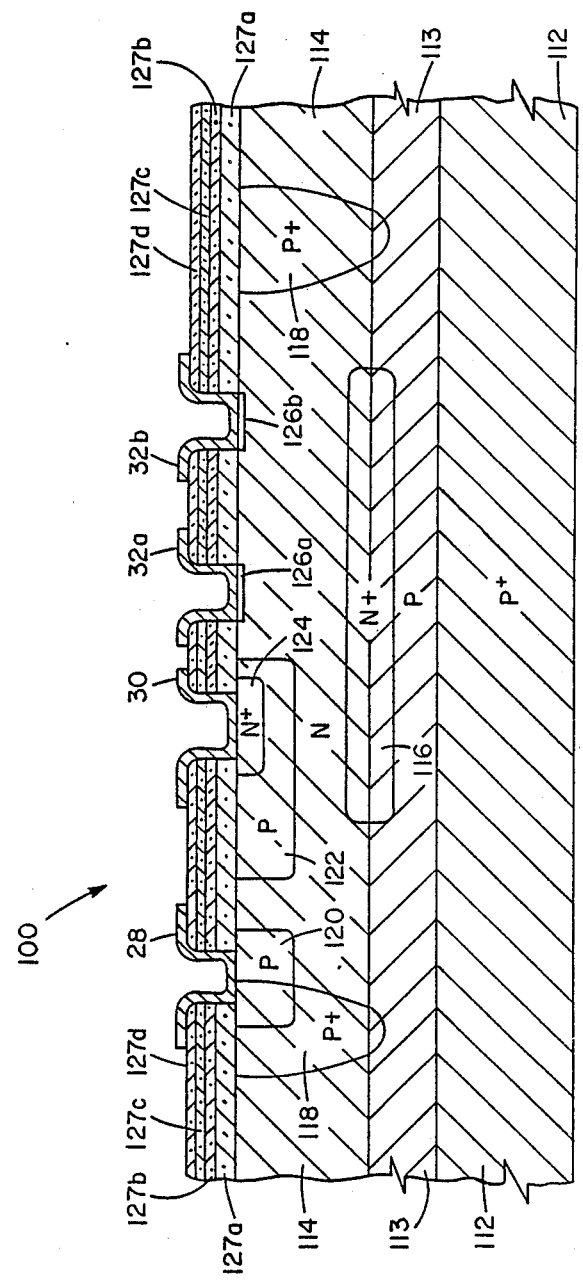
FIG. 1A PRIOR ART
FIG. 1B

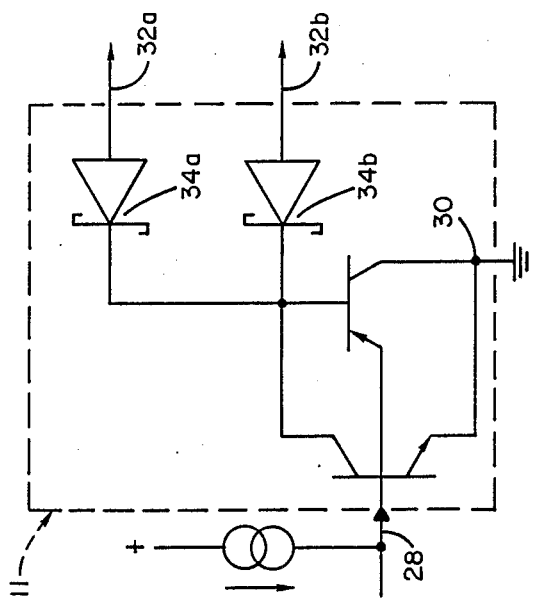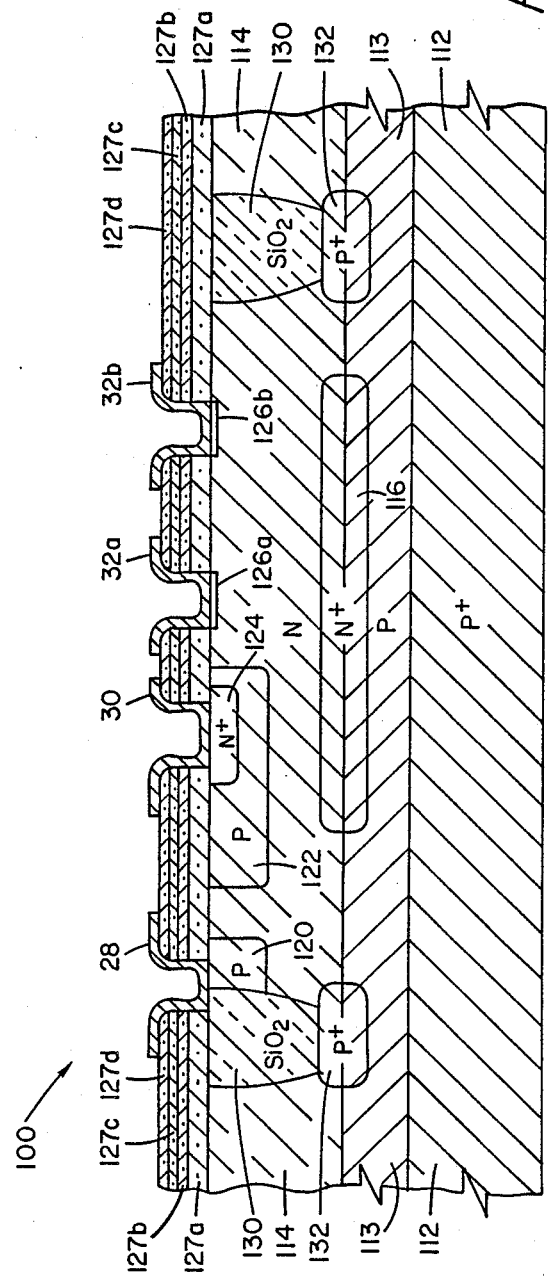

SEMICONDUCTOR DEVICE

This application is a continuation of application Ser. No. 145,700 filed Jan. 15, 1988 now abandoned.

BACKGROUND OF THE INVENTION

This invention relates generally to semiconductor structures and more particularly to semiconductor structures having reversed-biased junctions to provide isolation between active devices and which are adapted to operate in a radiation environment.

As is known in the art, one technique used to form an integrated circuit is to provide a semiconductor substrate with an epitaxial layer grown thereon, the substrate and the epitaxial having opposite-type conductivities. The substrate is moderately doped to provide a suitable breakdown voltage for active devices formed in the epitaxial layer. Active devices formed in the epitaxial layer are typically electrically isolated from one another by isolation regions extending vertically through the epitaxial layer to the substrate. Such isolation regions may comprise semiconductor material having the same conductivity type as that of the substrate. Alternately, the isolation regions may further comprise an electrical insulator disposed on semiconductor material of the same conductivity type as the substrate. Electrical isolation is achieved by applying a reverse-bias between the substrate and the epitaxial layer.

With such type of isolation, however, when the structure is exposed to radiation, such as x-ray or gamma ray radiation, electron-hole pairs (i.e. majority and minority carriers) having relatively long lifetimes and diffusion lengths are generated in the moderately-doped substrate material. Those relatively-long-diffusion-length carriers which reach the reverse-biased junction between the substrate and the epitaxial layer produce an electrical current which, in addition to the reverse-bias leakage current produced at such reverse-biased junction, reduces the electrical isolation between active devices formed on different regions of the epitaxial layer. Such increased current at such reverse-biased junction also may produce "logic upset", that is, slight conduction of an "OFF" active device in an amount sufficient to prevent an "ON" active device coupled thereto from further conducting, thus turning such device "OFF".

One technique used to reduce the effect of radiation is to use a dielectric material as the substrate. One such material is sapphire, a relatively expensive material, on which it may be difficult to form an epitaxial layer. Another is polycrystaline-silicon, with a silicon epitaxial layer. Generally, however, there are manufacturing difficulties with using an insulating substrate.

SUMMARY OF THE INVENTION

In accordance with the present invention, a semiconductor structure is provided comprising: a substrate of semiconductor material having a first-type doping conductivity; a first layer of semiconductor material epitaxially formed on the substrate, such first layer having the first-type doping conductivity; and, a second layer of semiconductor material epitaxially formed on the first layer, such second layer having a second-type doping conductivity opposite to the first-type doping conductivity. The first layer and the second layer form a P-N junction, which is typically reverse-biased to provide isolation between devices formed in such semiconductor structure. The concentration of dopant in the first layer is less than that in the substrate, and the thickness of the first layer is selected to be greater than the diffusion length of electron-hole pairs (i.e. majority and minority carriers) emitted by the substrate in response to incident radiation and substantially less than the substrate thickness. With such arrangement, the number of radiation-produced carriers which reach the P-N junction between the first and second layers and contribute to the reverse-bias leakage current at such junction is greatly reduced, thereby decreasing the effects of incident radiation on the isolation between active devices formed in the second layer.

In a preferred embodiment of the present invention, means, formed in the second layer, are further included for providing additional electrical isolation between active devices formed in different regions of the second layer of semiconductor material. In one embodiment, such means comprises a region comprising semiconductor material having the first-type doping conductivity, the region being disposed through the thickness of the second layer and extending a predetermined distance into the first layer, thereby forming a reverse-biased junction between said region and the second layer. In another embodiment, the region further comprises electrically insulating material, such as silicon dioxide.

The present invention also provides a method of fabricating a semiconductor structure, comprising the steps of: providing a substrate of semiconductor material having a first-type doping conductivity; epitaxially forming on the substrate a first layer of semiconductor material having the first-type doping conductivity in a concentration lower than a concentration of dopant in the substrate; and, epitaxially forming on the first layer a second layer of semiconductor material having a second-type doping conductivity opposite the first-type doping conductivity.

BRIEF DESCRIPTION OF THE DRAWINGS

The foregoing features of the present invention and the advantages thereof may be fully understood from the following detailed description read in conjunction with the accompanying drawings wherein:

FIG. 1A is a cross-sectional view of a semiconductor device structure of the prior art;

FIG. 1B is a cross-sectional view of the semiconductor device structure of the present invention;

FIG. 1C is a schematic diagram of the semiconductor structures of FIG. 1A and FIG. 1B; and FIG. 2 is a cross-sectional view of a second embodiment of the semiconductor device structure of the present invention.

DESCRIPTION OF THE PREFERRED EMBODIMENTS

Referring now to FIG. 1A, shown is a cross-section of a semiconductor device structure 10 of the prior art implementing the ISL (integrated Schottky logic) circuit shown schematically in FIG. 1C. The fabrication process for structure 10 is described in detail in U.S. Pat. No. 4,512,076, entitled "Semiconductor Device Fabrication Process" and assigned to the present assignee. Semiconductor structure 10 comprises bulk substrate 12, here comprising p-type silicon having a surface in the <100> crystalgraphic plane and a resistivity of about 2 ohm-cm. Bulk substrate 12 is of conventional thickness, here approximately 450-640 micrometers ($\mu$m) depending on the diameter of the wafer in which structure 10 is embodied. Epitaxial layer 14 of n-type conductivity silicon is grown in a conventional manner over the upper surface of bulk substrate 12, and n+-type subcollector region 16 is formed by diffusion and is disposed as shown in an upper region of substrate 12 and a lower region of epitaxial layer 14. Here, n-type epitaxial layer 14 is 2.7 to 3.3 micrometers ($\mu$m) thick and has a resistivity of between 0.25 and 0.35 ohm-cm. A pair of p-type conductivity isolation channels 18 are formed in epitaxial layer 14 by diffusing suitable p-type conductivity dopant into epitaxial layer 14. A pair of p-type conductivity regions 20, 22 are formed by diffusion in epitaxial layer 14 and driven by heat to a predetermined depth in epitaxial layer 14, as described in the above-identified patent. It is noted that p-diffusion region 20 extends both into epitaxial layer 14 and isolation channel 18, as discussed in a article entitled, "ISL, A Fast and Dense Low-Power Logic, Made in a Standard Schottky Process", by Jan Lohstroh and published in the IEEE Journal of Solid State Circuits, Vol SC-14, No. 3, June 1979, pages 585–590. An n+-type conductivity emitter region 24 is diffused into p-diffusion region 22. Schottky contact layers 26a, 26b, here comprising platinum silicide, are formed in surface regions of epitaxial layer 14 in the manner described in the above-identified patent. It is noted that during the above-described fabrication process, several insulating layers 27a, 27b, 27c, 27d are formed over the upper surface of epitaxial layer 14. The formation of such insulating layers is fully described in the above-identified U.S. Pat. No. 4,512,076. Here, layers 27a, 27b and 27d comprise silicon dioxide, while layer 27c comprises silicon nitride. Suitable metal contact electrodes 28, 30, 32a, 32b are provided in any conventional manner to provide the ISL circuit 11 shown in FIG. 1C. It is noted that base contact electrode 28 provides the input to the ISL gate and that emitter contact electrode 30 is adapted for coupling to ground, as shown in FIG. 1C. The Schottky platinum silicide regions 26a, 26b provide, together with output electrodes 32a, 32b, a pair of Schottky diodes, 34a, 34b, the anodes therof being coupled to such output electrodes 32a, 32b, as shown.

In operation, a bias potential is typically applied to p-type conductivity substrate 12 by means not shown, such bias being sufficient to produce a reverse-bias at the P-N junction between substrate 12 and n-type conductivity epitaxial layer 14 and at the P-N junction between p-type conductivity isolation channels 18 (in electrical contact with substrate 12) and epitaxial layer 14. The reverse-biased junction between substrate 12 and epitaxial layer 14 provides vertical electrical isolation between ISL circuit 11 and other devices, such as adjacent ISL circuits, formed on substrate 12, and the reverse-biased junction between channels 18 and epitaxial layer 14 provides horizontal electrical isolation between ISL circuit 11 and such other devices. As is known, however, a certain amount of reverse-bias leakage current unavoidably flows at such reverse biased junctions, leading to decreased isolation between active devices formed on substrate 12, such as adjacent ISL circuits. As is also known, when semiconductor structure 10 is exposed to radiation, such as x-ray or gamma ray radiation, electron-hole pairs are generated in the moderately-doped (e.g. 2 ohm-cm-resistivity) substrate 12. Those electron-hole pairs which are generated within one diffusion length of the reverse-biased vertical and horizontal P-N isolation junctions add to the above-discussed reverse-bias leakage current, thus further reducing the electrical isolation between active devices, such as adjacent ISL circuits, formed on substrate 12. Such increased reverse-bias leakage current may become large enough to produce "logic upset", that is, slight conduction of an "OFF" (i.e. otherwise nonconducting) active device in an amount sufficient to prevent an "ON" (i.e. otherwise conducting) active device coupled thereto from further conducting, thus turning such device "OFF".

Referring now to FIG. 1B, the semiconductor device structure 100 of the present invention is shown. Semiconductor device structure 100 solves the above-identified radiation-induced problems by providing: a bulk substrate 112 having a very high dopant concentration of a first-type dopant conductivity (here, of p-type dopant) and hence a very low resistivity (here, on the order of 0.01 ohm-cm); and, a pair of epitaxial layers 113, 114, first epitaxial layer 113 having the same first-type dopant conductivity (here, p-type) as bulk substrate 112, but having a much lower dopant concentration and hence a resistivity greater, here on the order of two orders of magnitude greater, than that of substrate 112. The second epitaxial layer 114 has a second-type dopant conductivity opposite that of the first-type dopant conductivity (here, n-type). An active circuit, such as ISL circuit 11 (FIG. 1C) is then formed over first epitaxial layer 113, rather than directly over bulk substrate 112, by a suitable process, such as that described briefly above and in detail in the above-identified U.S. Pat. No. 4,512,076. First epitaxial layer 113 has a thickness selected to be as small as possible while still providing sufficient breakdown voltage for active devices formed in second epitaxial layer 114 and being thicker than the diffusion length of electron-hole pairs emitted by substrate 112 in response to incident radiation, as will be described.

Referring with more particularity to FIG. 1B, bulk substrate 112 comprises highly doped (here, with p-type dopant) silicon having a resistivity on the order of 0.01 ohm-cm. It is noted that the resistivity of substrate 112 is two orders of magnitude less than the resistivity of prior art substrate 12 (FIG. 1A). Bulk substrate 112 is of conventional thickness, such thickness here being about 450 to 640 $\mu$m, depending on the diameter of the wafer embodying structure 100 (as per SEMI standards). Grown over substrate 112 is first epitaxial layer 113 of the same type dopant conductivity as substrate 112 (here, p-type) but having a significantly lower dopant concentration than substrate 112. Here, the dopant concentration of first epitaxial layer 113 is selected to yield a resistivity of about 2 ohm-cm for such layer 113. It has been found that a resistivity of 2 ohm-cm for first epitaxial layer 113 optimizes the structure of the vertical PNP transistor included in ISL circuit 11. Different resistivities may be used for devices other than ISL devices formed on semiconductor body 100. It is noted that the resistivity of first epitaxial layer 113 is of the same order of magnitude as the resistivity of bulk substrate 12 (FIG. 1A) of prior art semiconductor device structure 10. First epitaxial layer 113 here has a thickness of between 10 and 12 micrometers ($\mu$m), although the precise thickness of first epitaxial layer 113 may be varied depending on the application, as will be discussed. It is noted that the selected thickness of first epitaxial layer 113 is much less than that of bulk substrate 112.

Grown over first epitaxial layer 113 in a conventional manner is second epitaxial layer 114, such second epitaxial layer 114 having a second-type dopant conductivity (here n-type) opposite to that of first epitaxial layer 113 and bulk substrate 112. Second epitaxial layer 114 is substantially equivalent in dopant concentration and thickness to epitaxial layer 14 (FIG. 1A) of prior art structure 10. Thus, here second epitaxial layer 114 is approximately 2.7 to 3.3 μm thick and has a resistivity of about 0.25 to 0.5 ohm-cm. It is understood that if other than ISL circuitry is formed on body 100, second epitaxial layer 114 may be given a different thickness and dopant concentration (and hence resistivity). Subcollector region 116, here an n+-type diffusion region, is formed in a well-known manner in an upper portion of first epitaxial layer 113 and a lower portion of second epitaxial layer 114, as shown. Isolation channels 118, here comprising highly doped p+-type diffusion regions, are formed as described above in second epitaxial layer 114. Here, such isolation regions 118 extend from the upper surface of second epitaxial layer 114 through such layer 114 and into upper regions of first epitaxial layer 113 by a predetermined amount. Such intrusion is made in order to compensate for small, unavoidable variations in the thickness of second epitaxial layer 114. That is, second epitaxial layer 114 may, when formed, be thicker in some regions than in others by a small amount. By extending isolation regions 118 deeper than the nominal thickness of second epitaxial layer 114, assurance is made that such p+-type isolation channels 118 reach p-type first epitaxial layer 113. If channels 118 were not to reach first epitaxial layer 113 (or to just barely contact it), the leakage current at the reverse-biased P-N junctions formed by isolation channels 118 and first epitaxial layer 113 with second epitaxial layer 114 would be increased, thereby, reducing the threshold of such P-N junctions and decreasing the vertical and horizontal electrical isolation provided by such reverse-biased junctions. Here, the depth of intrusion of isolation channels 118 into first epitaxial layer 113 is selected to be 10% to 20% of the thickness of such layer 113.

The remainder of ISL circuit 11 (FIG. 1C) is formed in n-type second epitaxial layer 114 in substantially the same fashion as such circuit is formed in epitaxial layer 14 (FIG. 1A) of prior art structure 10 and as described above. Thus, p-type diffusion regions 120, 122 are formed in second epitaxial layer 114 and driven to a predetermined depth therein by heating structure 100. Again, it is noted that p-type base diffusion region 120 extends into both second epitaxial layer 114 and isolation channel 118. The n+-type emitter region 124 is diffused into p-diffusion region 122. Schottky contact layers 126a, 126b, here comprising platinum silicide, are formed in upper surface regions of second epitaxial layer 114 in the manner described in the above-identified U.S. Pat. No. 4,512,076. Insulating layers 127a, 127b, 127c, 127d are formed during fabrication of semiconductor device structure 100, as discussed above. Here, layers 127a, 127b and 127d comprise silicon dioxide, while layer 127c comprises silicon nitride. Metal contact electrodes 28, 30, 32a, 32b (so numbered to be consistent with FIG. 1C) are formed to provide the ISL circuit 11 shown in FIG. 1C.

The ISL circuit 11 provided by semiconductor device structure 100 is substantially electrically equivalent to that provided by prior art semiconductor device structure 10 (FIG. IA). As stated, the thickness of second epitaxial layer 114 is here selected to be 2.7-3.3 μm, but such thickness may be varied depending on the application of semiconductor device structure 100. Second epitaxial layer 114 must be maintained sufficiently thick, however, to provide space for depletion widths associated with a reverse-biased collector (such as the collector region formed by second epitaxial layer 114 between isolation channels 118) and subcollector (such as subcollector 116) of an active device formed over such second epitaxial layer 114.

In operation, when semiconductor device structure 100 is exposed to radiation, such as x-ray or gamma ray radiation, the total amount of electron-hole pair current generated in semiconductor device structure 100 is substantially reduced over the amount of electron-hole pair current generated in prior art structure 10 (FIG. 1A). Such reduction is in part due to heavily doping bulk substrate 112 to have a resistivity much lower than that of bulk substrates of the prior art, such as substrate 12 of FIG. 1A. Here, bulk substrate 112 is heavily doped with p+-type dopant to have a resistivity of approximately 0.01 ohm-cm. This is to be compared with prior art substrate 12, which has a resistivity on the order of 2 ohm-cm resulting from lighter doping. The heavy doping of bulk substrate 112 reduces both the lifetime and the diffusion length of electron-hole pairs (i.e., the minority and majority carriers, respectively in p+-type substrate 112) emitted by substrate 112 in response to radiation incident on substrate 112. For example, minority carrier lifetime in the heavily-doped, 0.01 ohm-cm resisitivity substrate 112 is $6 \times 10^{-9}$ seconds, much shorter than the $3.4 \times 10^{-6}$ seconds minority carrier lifetime in moderately-doped substrates having a resistivity on the order of 2 ohm-cm, such as substrate 12 of prior art structure 10 (FIG. 1A). To put it another way, the recombination rate of separated (for example by incident radiation) electron-hole pairs is much higher in substrate 112 than in prior art substrate 12, due to the lower minority carrier lifetime of the former. Additionally, minority carrier diffusion length in heavily-doped, 0.01 ohm-cm resistivity substrate 112 is approximately 1.5 μm, as opposed to a diffusion length of approximately 98 μm for minority carriers in moderately-doped, 2 ohm-cm resistivity prior art substrate 12. Since the thickness of first epitaxial layer 113 here is selected to be between 10 μm and 12 μm, few, if any, of the carriers emitted by substrate 112 can reach the reverse biased P-N isolation junctions of semiconductor body 100. A little thought reveals that the reverse-biased P-N isolation junctions of semiconductor body 100 comprise the junctions between: (1) first epitaxial layer 113 and second epitaxial layer 114; (2) first epitaxial layer 113 and subcollector region 116; and (3) isolation channels 118 and second epitaxial layer 114. Reverse-biased junctions (1) and (2) provide vertical electrical isolation for the devices of ISL circuit 11 from adjacent devices formed on semiconductor body 100, while reverse-biased junction (3) provides horizontal electrical isolation for ISL circuit 11 from such adjacent devices. Therefore, the majority and minority carriers which are emitted by highly-doped substrate 112 are substantially prevented from reaching such reverse-biased junctions, since, as discussed below, the thickness of first epitaxial layer 113 is selected to be greater than the relatively short diffusion length of such carriers emitted by such substrate 112.

As discussed, first epitaxial layer 113 is doped with the same type conductivity dopant (here, p-type) as bulk substrate 112 but with a lower concentration thereof to provide a resistivity for first epitaxial layer 113 of about 2 ohm-cm. First epitaxial layer 113 provides a region of sufficiently lightly doped material (and thus of sufficient resistivity) to minimize incremental collector junction capacitance of transistors formed in structure 100 while providing sufficient breakdown voltages for such transistors. First epitaxial layer 113, being moderately doped, will emit in response to incident radiation electron-hole pairs (i.e. minority and majority carriers in p-type layer 113) having relatively long lifetimes (approximately $3.4 \times 10^{-6}$ sec.) and diffusion lengths (about 98 $\mu$m) as compared to the electron-hole pairs emitted by highly-doped bulk substrate 112. However, the thickness of first epitaxial layer 113 is selected to be substantially smaller than that of substrate 112 yet larger than the diffusion length of electron-hole pairs emitted by bulk substrate 112 and of sufficient thickness to provide sufficient breakdown voltage for active devices formed in second epitaxial layer 114. Here, the thickness of first epitaxial layer is 113 selected to be between 10 $\mu$m and 12 $\mu$m. Therefore, the available volume of relatively moderately-doped, high resistivity (i.e. 2 ohm-cm) material present in structure 100 is quite small. To put it another way, while electron-hole pairs generated in first epitaxial layer 113 in response to incident radiation will have sufficiently long lifetimes and diffusion lengths to reach the above-identified reverse-biased junctions of structure 100, the volume of first epitaxial layer 113 is sufficiently small so that few long-lifetime, long-diffusion-length electron-hole pairs are generated in such layer 113. The number of electron-hole pairs generated in first epitaxial layer 113 may be reduced even further by reducing the thickness, and hence the volume, of layer 113. However, first epitaxial layer 113 must be maintained sufficiently thick to provide a suitable breakdown voltage for transistors formed in structure 100.

To summarize, the double-epitaxial layer semiconductor device structure 100 of the present invention produces significantly reduced amounts of radiation-induced electron-hole pair current at the above-identified reverse-biased P-N isolation junctions thereof by a combination of two effects: (1) highly-doped, low resistivity bulk substrate 112 emitting electron-hole pairs having relatively short diffusion lengths and lifetimes; and, (2) more moderately-doped, higher-resistivity first epitaxial layer 113 of the same dopant conductivity type as substrate 112 providing reduced volume (substantially smaller than that of bulk substrate 112) from which electron-hole pairs of sufficient lifetime and diffusion length to reach the reverse biased P-N isolation junctions are generated, while further providing sufficient thickness to prevent the short-diffusion-length electron-hole pairs emitted by highly-doped substrate 112 from reaching such reverse-biased P-N junctions. With such arrangement, a semiconductor device structure 100 with a decreased sensitivity to incident radiation is provided and may be fabricated using available fabrication processes, such as that described in the above-identified U.S. Pat. No. 4,512,076. Thus, there is no need to fabricate the bulk substrate from dielectric material, such as sapphire or polycrystaline silicon, which are expensive materials and present fabrication difficulties.

It should be noted here that it is not necessary to maintain a two order-of-magnitude difference between the resistivities of bulk substrate 112 and first epitaxial layer 113 in order to achieve decreased sensitivity to radiation effects. For example, bulk substrate 112 may be doped less heavily than discussed above to have a resistivity of 0.1 ohm-cm, for example. Electron-hole pairs generated in substrate 112 would still exhibit decreased lifetimes ($2.7 \times 10^{-8}$ sec.) and diffusion lengths (about 5 $\mu$m) over the high resistivity (on the order of 2 ohm-cm) bulk substrate 12 used in prior art structure 10 (and having carrier lifetimes and diffusion lengths of $3.4 \times 10^{-6}$ sec. and 98 $\mu$m, respectively). The diffusion length of the carriers in a 0.1 ohm-cm resistivity substrate 112 is seen to still be less than the selected thickness (10–12 $\mu$m) of first epitaxial layer 113. Thus, few, if any, of such carriers reach the reverse-biased P-N isolation junctions of structure 100. The dopant concentration difference between bulk substrate 112 and first epitaxial layer 113, and hence the resistivity ratio therebetween, will depend on the amount of radiation hardness desired, as well as on the electrical parameters of the devices formed on semiconductor structure 100.

Referring now to FIG. 2, a second embodiment of the semiconductor device structure 100 of the present invention is shown using electrically insulating regions 130, here comprising silicon dioxide (SiO$_2$), and p$^+$-type channel stop regions 132 in place of p$^+$-type diffusion isolation channels 118 (FIG. 1B). Alternately, regions 130 may comprise other suitable dielectric media, such as amorphous silicon. As shown, SiO$_2$ regions 130 extend from the upper surface of second epitaxial layer 114 and terminate at a predetermined depth of layer 114. That is, SiO$_2$ regions 130 do not extend completely through second epitaxial layer 114. SiO$_2$ regions 130 terminate at upper regions of p$^+$-type channel stops 132, which are formed in a conventional manner, such as by diffusion. As shown, p$^+$-type channel stops 132 extend from upper regions of first epitaxial layer 113 into overlaying lower regions of second epitaxial layer 114 for the reasons discussed above regarding isolation channels 118. Thus, it may be appreciated that p$^+$-type channel stops help provide an increased-threshold-reverse-biased P-N junction between adjacent circuits, such as ISL circuits 11 (FIG. 1C), formed in semiconductor device structure 100. It is noted that when insulating regions 130 are used to provide dielectric horizontal isolation (rather than the junction horizontal isolation provided by isolation channels 118 of FIG. 1B), the thickness of second epitaxial layer 114 may be reduced. Here, such thickness is decreased to between about 1.1 $\mu$m and 1.7 $\mu$m.

Alternately, SiO$_2$ regions 130 may be extended into p-type first epitaxial layer 113. In such case, p$^+$-type channel stops 132 need not be formed below SiO$_2$ regions 130 if the p-type dopant concentration of first epitaxial layer 113 is sufficiently high. In yet another embodiment, insulating regions 130 may be extended completely through second epitaxial layer 114 and first epitaxial layer 113 and into p$^+$-type substrate 112. Due to the high dopant concentration of p$^+$-type substrate 112, p$^+$-type channel stops 130 need not be formed in such case.

Having described preferred embodiments of the present invention, other embodiments may become apparent to those skilled in the art. For example, bulk substrate 112 could be fabricated using n$^+$-type silicon, in which case first epitaxial layer 113 would also be doped with n-type dopant and second epitaxial layer 114 doped with p-type dopant. Further, the present invention may be utilized with circuitry types, such as TTL, ECL, etc, other than ISL. In addition, the present invention may be applied to reduce radiation effects in circuits made using semiconductor material other than silicon, such as gallium-arsenide. Finally, field-effect, as well as bipolar, transistors may be formed in semiconductor device structures of the present invention. Accordingly, it is understood that the scope of the present invention is to be limited only by the scope of the appended claims.

What is claimed is:

1. A semiconductor structure comprising:
   (a) a substrate comprising semiconductor material having a first-type doping conductivity and a first predetermined thickness;
   (b) a first layer of semiconductor material disposed on the substrate, said first layer having the first-type doping conductivity and a dopant concentration lower than a dopant concentration in the substrate, said first layer having a second predetermined thickness substantially less than the first predetermined thickness of the substrate;
   (c) a second layer of semiconductor disposed on the first layer of semiconductor material, said second layer having a second-type doping conductivity opposite to the first-type doping conductivity; and
   (d) a digital circuit formed in the second layer using bipolar junction technology.

2. The semiconductor structure of claim 1 wherein the dopant concentration in the substrate is substantially two orders of magnitude greater than the dopant concentration in the first layer.

3. The semiconductor structure of claim 1 wherein the first and second layers form a P-N junction.

4. The semiconductor structure of claim wherein the second predetermined thickness is an order of magnitude less than the first predetermined thickness.

5. The structure of claim 1 wherein the substrate is doped to have a conductivity on the order of 0.01 ohm-centimeters.

6. The structure of claim 1 wherein the thickness of the first layer is less than 12 micrometers.

7. The structure of claim 5 wherein the thickness of the first layer is less than 12 micrometers.

8. The structure of claim 5 wherein the first layer is doped to have a conductivity on the order of 1 ohm-centimeter.

9. A semiconductor structure comprising:
   (a) a substrate, said substrate comprising semiconductor material having a first-type doping conductivity and a first dopant concentration said semiconductor material comprising means for emitting, in response to incident radiation, electron-hole pairs having a predetermined diffusion length;
   (b) a first semiconductor layer disposed over the substrate, said first layer having the first-type doping conductivity, a second dopant concentration; and a second thickness; and
   (c) a second layer of semiconductor material disposed over the first layer, said second layer having a second-type doping conductivity opposite to the first-type doping conductivity so as to form a p-n junction between the first and second semiconductor layers;
   (d) a plurality of transistor devices formed in the second layer, each of such transistor devices electrically isolated from the substrate by the p-n junction; and,
   (e) wherein the second thickness, the first dopant concentration, and the second dopant concentration are selected to inhibit an increase in the electron-hole pair concentration at the p-n junction in response to incident radiation.

10. The semiconductor structure of claim 9 wherein the second thickness is
    (a) sufficient to provide a suitable breakdown voltage for the plurality of transistor devices; and
    (b) substantially less than the thickness of the substrate.

11. The semiconductor structure of claim 10 wherein the second dopant concentration of the first semiconductor layer is substantially two orders of magnitude less than the first doping concentration of the substrate.

12. A semiconductor structure comprising;
    (a) a substrate comprising semiconductor material having a first-type doping conductivity in a first dopant concentration, said substrate having a predetermined thickness;
    (b) a first layer of semiconductor material epitaxially formed on the substrate, said first layer having the first-type doping conductivity in a second dopant concentration lower than the first dopant concentration, said first layer having a thickness substantially less than the predetermined thickness of the substrate;
    (c) a second layer of semiconductor material epitaxially formed on the first layer, said second layer having a second-type doping conductivity opposite to the first-type doping conductivity and forming a p-n junction with the first layer; and
    (d) means, formed in the second layer, for providing electrical isolation between active devices formed in different regions of the second layer of semiconductor material, each one of the active devices comprising: a first semiconductor region having a first conductivity type; a second semiconductor region, having the first conductivity type; and a third semiconductor region, disposed between the first and second semiconductor regions, having a conductivity type opposite the first conductivity type, and each one of active devices operating without current flow across the p-n junction.

13. The semiconductor structure of claim 12 wherein the electrical isolation providing means comprises a region disposed through the entire thickness of the second layer and extending a predetermined distance into the first layer.

14. The semiconductor structure of claim 13 wherein said predetermined distance is approximately 20% of the thickness of the first layer.

15. The semiconductor structure of claim 12 wherein each of the active devices is a bipolar junction transistor wherein the first semiconductor region is an emitter region in the transistor, the second semiconductor region is a collector region of the transistor and the third semiconductor region is a base region of the transistor.

16. The semiconductor structure of claim 12 wherein the first dopant concentration in the substrate is at least one order of magnitude greater than the second dopant concentration in the first layer.

17. The semiconductor structure of claim 12 wherein
    (a) the first doping conductivity of the substrate is substantially 0.01 ohm/cm; and
    (b) the second doping conductivity of the first layer is substantially 2 ohm/cm.

18. The semiconductor structure of claim 17 wherein the first layer is substantially 10 micrometers thick.

19. The semiconductor structure of claim 12 wherein the semiconductor material comprises silicon.

* * * * *

UNITED STATES PATENT AND TRADEMARK OFFICE
CERTIFICATE OF CORRECTION

PATENT NO.   :   4,936,928
DATED        :   June 26, 1990
INVENTOR(S)  :   Gerard J. Shaw and Jok Y. Go It is certified that error appears in the above-identified patent and that said Letters Patent is hereby corrected as shown below:

Title page: Item [63] should read --which is a continuation of Serial No. 802,397 filed 11/27/85--

In the Abstract, Line 11, delete "conductvity" and insert therefore --conductivity--.

Column 1, Line 5, after "abandoned", insert --, which was a continuation of application Serial No. 802,397 filed November 27, 1985--.

Signed and Sealed this

Twenty-second Day of October, 1991

Attest:

HARRY F. MANBECK, JR.

*Attesting Officer*        *Commissioner of Patents and Trademarks*